United States Patent [19]

Harnden

[11] Patent Number: 4,841,166
[45] Date of Patent: Jun. 20, 1989

[54] LIMITING SHOOT-THROUGH CURRENT IN A POWER MOSFET HALF-BRIDGE DURING INTRINSIC DIODE RECOVERY

[75] Inventor: James A. Harnden, San Jose, Calif.

[73] Assignee: Siliconix Incorporated, Santa Clara, Calif.

[21] Appl. No.: 74,903

[22] Filed: Jul. 17, 1987

[51] Int. Cl.$^4$ .................. H03K 19/094; G05F 1/46
[52] U.S. Cl. ..................... 307/246; 307/296.5; 307/572; 307/270; 307/491
[58] Field of Search ............... 307/246, 570, 573, 572, 307/270, 497, 296.5, 304, 314, 491

[56] References Cited

U.S. PATENT DOCUMENTS

| 4,347,445 | 8/1982 | Baker | 307/270 |
| 4,449,064 | 5/1984 | Eckert et al. | 307/270 |
| 4,667,144 | 5/1987 | Jones et al. | 307/270 |

OTHER PUBLICATIONS

MOSPOWER Applications Handbook, particularly Chapter 5.4 entitled "$dV_{DS}/dt$ Turn-On in MOSFETs (TA84-4)", (pp. 5-7 through 5-64) and Chapter 5.5 entitled Inverse Diodes of Power MOSFETs (pp. 5-65 through 5-68).

Primary Examiner—Stanley D. Miller
Assistant Examiner—Richard Roseen
Attorney, Agent, or Firm—Steven F. Caserza

[57] ABSTRACT

A novel closed loop feedback circuit is provided which senses the shoot-through current of a power switching device driving an inductive load. If excessive shoot-through current is sensed, the closed loop causes a reduction of the gate drive to the Power MOSFET contained in the power switching circuit, thereby slowing its turn on time, and in turn reducing the shoot-through current.

14 Claims, 3 Drawing Sheets

LIMITING SHOOT-THROUGH CURRENT IN A POWER MOSFET HALF-BRIDGE DURING INTRINSIC DIODE RECOVERY

BACKGROUND OF THE INVENTION

This invention solves a problem related to using Power MOSFET intrinsic diodes to clamp inductive flyback energy in a half-bridge configuration.

Both N-channel and P-channel Power MOSFET devices contain intrinsic diodes that can be used to clamp inductive flyback energy from an inductive load when used in a half-bridge configuration. This eliminates the need for adding discrete fast recovery diodes to clamp the resulting flyback voltage between the supply voltage and ground. Whether the intrinsic Power MOSFET diodes or discrete diodes are used, the reverse recovery time (Trr) is of concern. Any time a diode is in forward conduction, and the opposing device in the half-bridge is switched "on," some recovery time will be required before recombination occurs and the conducting diode begins to block reverse voltage. This can be illustrated with regard to FIG. 1A through 1C. In FIG. 1A, Power MOSFET Q2 is on and Power MOSFET Q1 is off, thus causing current to flow from positive supply terminal 10 through load 11, through conducting Power MOSFET Q2, to ground. As shown in FIG. 1B, when Power MOSFET Q2 turns off, inductive load 11 generates a current which causes the intrinsic diode of Power MOSFET Q1 to be forward biased, thereby clamping the flyback voltage generated by load 11. As shown on FIG. 1C, Power MOSFET Q2 then turns on in order to cause current flow through load 11. However, during a brief time period after Power MOSFET Q2 turns on while the instrinsic diode Power MOSFET was in the forward biased state, the instrinsic diode of Power MOSFET Q1 is free to conduct current in reverse. This creates a low impedance path through reverse conducting intrinsic diode of Power MOSFET Q1 and conducting Power MOSFET Q2, directly from power supply terminal 10 to ground. This so-called "shoot-through current" through this low impedance path can build to component damaging levels during the recovery time of the intrinsic diode of Power MOSFET Q1 if some method of control is not implemented.

In the simple example shown in FIGS. 1A through 1C, transistor Q1 is placed in the circuit solely for the purpose of providing an intrinsic diode. Similarly, in the example of FIGS. 1A through 1C, transistor Q2 includes an intrinsic diode which never conducts in its forward direction, and thereby does not cause a problem with regard to shoot-through current. However, the circuit of FIG. 1D shows an example where two MOSFET transistors Q1 and Q2 are arranged where both are controlled by control currents $\phi$ and $\bar{\phi}$, respectively. Transistor Q1, when turned on, provides a current path between positive supply voltage V+ to inductive load L and thence to ground. Conversely, when transistor Q2 is conducting, a path is formed from ground through inductive load L, and through MOSFET Q2 to negative supply voltage V−. In the embodiment of FIG. 1D, the intrinsic diodes of both MOSFETs Q1 and Q2 will, depending on the state of operation, be forward biased to conduct inductive current, and thus each intrinsic diode of MOSFETs Q1 and Q2 will, during various operating conditions, provide a potential shoot-through problem during their recovery times $T_{rr}$.

Discrete diodes, when used to clamp inductive flyback energy, can be sized to handle considerable current during recovery, and fabricated to have fast recovery times to minimize shoot-through current. Unfortunately, simply paralleling the intrinsic diode of a Power MOSFET with a discrete fast recovery diode, to replace switching MOSFETs Q1 of FIGS. 1A through 1C, or either one or both of switching MOSFETs Q1 and Q2 of FIG. 1D, as shown in FIG. 2A, does not solve the recovery time problems. For example, if the discrete diode does not have a significantly lower forward voltage drop, the intrinsic diode will share the forward current and still require some amount of recovery time. If this occurs, and the discrete diode recovers first, the intrinsic diode is left as vulnerable as without the paralleled, fast recovery diode. To assure reliable bypassing of flyback energy through a discrete diode, the addition of a series diode is required as in FIG. 2B to block any forward conduction current through the intrinsic diode of the Power MOSFET. Unfortunately, adding a series blocking diode increases forward voltage drop and negates the advantages of increased efficiency which would otherwise be obtained using Power MOSFETs with low source to drain resistance ($R_{DS}$(on)).

Using the intrinsic diodes of Power MOSFETs eliminates the cost, space, and added voltage loss of adding discrete diodes. When using the intrinsic diodes of Power MOSFETs, care must be taken to protect them from destructive $dV_{DS}/dt$ rates and excessive current during recovery. However, Trr of the Power MOSFET intrinsic diode is not specified as consistently as discrete fast recovery diode, and Trr specifications differ between manufacturers of otherwise compatible Power MOSFETs.

Traditionally the problem of excess shoot-through current during the recovery time of the intrinsic diode of the Power MOSFET has been addressed by simply reducing the gate drive to the Power MOSFET and slowing the turn-on time of the opposing Power MOSFET. This allows the intrinsic diode additional time to recover before shoot-through current builds to an unacceptable level, and reduces the resulting $dV_{DS}/dt$ after recovery.

FIG. 3 demonstrates one commonly used method of slowing Power MOSFET turn-on rate without increasing the turn-off time. During turn-on of Power MOSFET Q1, Resistor R1 limits the current available for charging the gate capacitance (Ciss) of Power MOSFET Q1, thereby slowing the turn-on of Power MOSFET Q1. Resistor R1 is commonly paralleled by a diode D1 to maintain minimum driver impedance during turn-off, and to hold Power MOSFET "off" in the static state.

Slowing turn-on of the "opposing" Power MOSFET (i.e. the Power MOSFET opposing the Power MOSFET which has an intrinsic diode which is in forward conduction) limits shoot-through current through the Power MOSFET being turned on during recovery of the conducting diode. While this method achieves the goal of limiting shoot-through current, it does so at the expense of switching losses. Since this method requires turn-on of the opposing Power MOSFET to always be based on "worst case" intrinsic diode recovery time, turn on of the opposing Power MOSFET is needlessly slowed if the intrinsic diode was not in forward conduction immediately prior to turn-on of the opposing Power MOSFET, since in this event the intrinsic diode does not require time to recover. Similarly, during those instances in which the intrinsic diode is in forward conduction immediately prior to turn-on of the opposing Power MOSFET, turn-on of the opposing Power MOSFET is needlessly slowed during the time required for transition of the gate voltage to full "enhancement voltage" after the intrinsic diode recovers.

"MOSPOWER Applications Handbook," published by Silicomix Incorporated of Santa Clara, Calif. 95054, 1984, is relevant reference material and is hereby incorporated by reference.

SUMMARY

In accordance with the teachings of this invention, a novel closed loop feedback circuit is provided which senses the shoot-through current of a power switching device driving an inductive load. If excessive shoot-through current is sensed, the closed loop causes a reduction of the gate drive to the non-opposing Power MOSFET contained in the power switching circuit, thereby slowing its turn on time, and in turn reducing the shoot-through current.

DETAILED DESCRIPTION

Figure 1A:
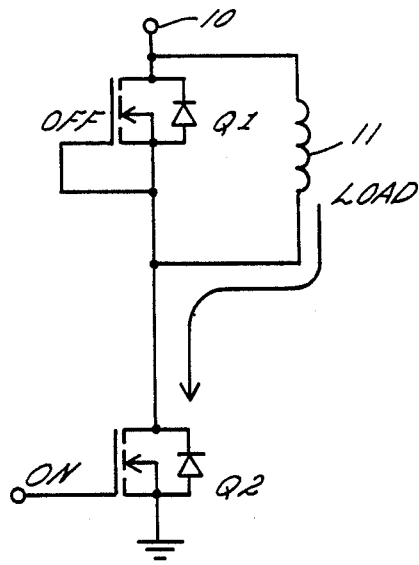
FIGS. 1A through 1D describe the forward current through the MOSFET, and reverse current through the MOSFET instrinic diodes, when MOSFETs are used to switch inductive loads.
Figure 1B:
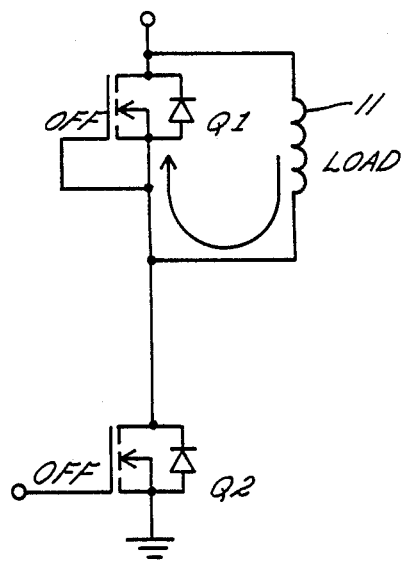
Figure 1C:
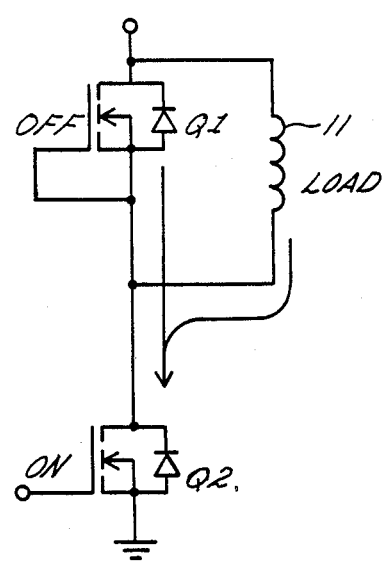
Figure 1D:
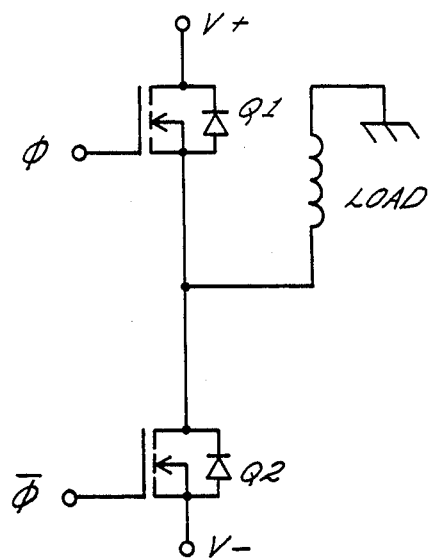
Figure 2A:
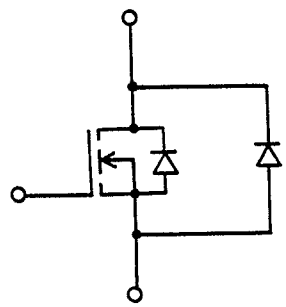
FIG. 2A is a prior art attempt to solve the problems of shoot-through current by adding a parallel diode.
Figure 2B:
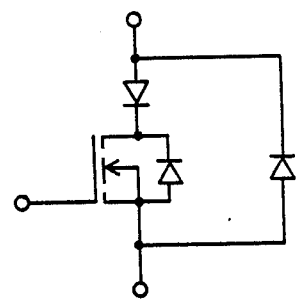
FIG. 2B is another prior art attempt to solve the problem of shoot-through current by adding both series and parallel diodes.
Figure 3:
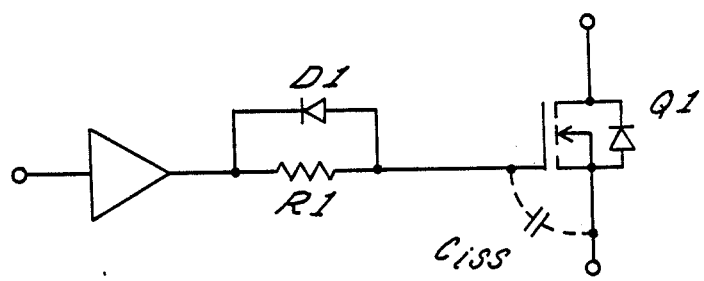
FIG. 3 is yet another prior art attempt to solve the problem of shoot-through current by instituting gate rise time control.
Figure 4:
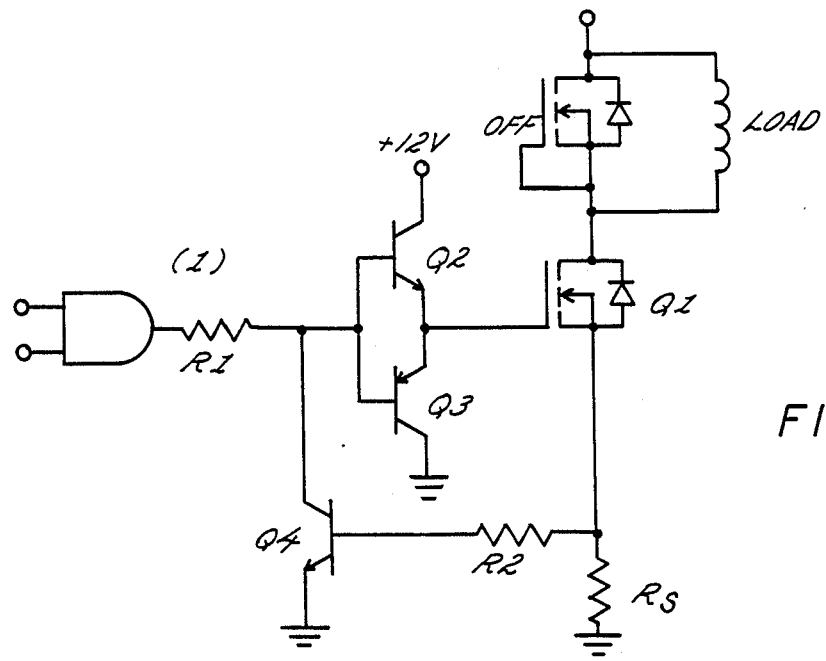
FIG. 4 is a schematic diagram of one embodiment of a circuit constructed in accordance with the teachings of this invention which effectively eliminates the problems of excessive shoot-through current.
Figure 5:
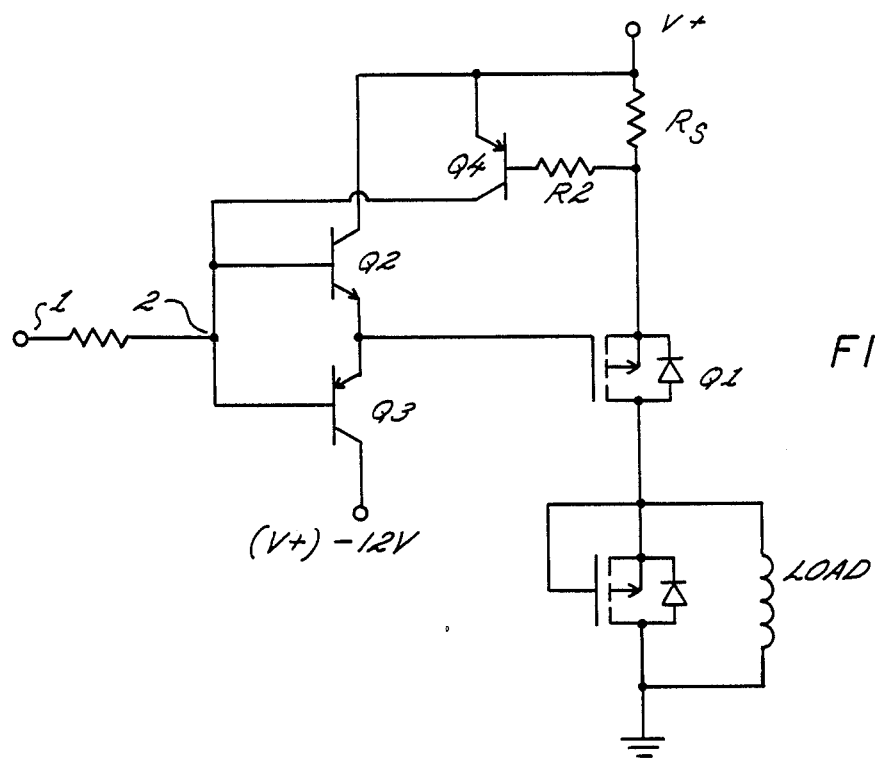
FIG. 5 is a schematic diagram of another embodiment of a circuit construction in accordance with the teachings of this invention.

One embodiment of a circuit construction in accordance with the teachings of this invention is shown in the schematic diagram of FIG. 4. As shown in FIG. 4, a closed loop feedback circuit has been added to sense excessive shoot-through current when Power MOSFET Q1 is switched "on." If excessive shoot-through current is sensed, the closed loop compensates by reducing gate drive to Power MOSFET Q1.

The circuit of FIG. 4 operates as follows: As the input control signal applied to lead 1 makes a transition from low to high, the output signal of the emitter-follower stage formed by transistors Q2 and Q3 follows in phase, providing a low impedance gate drive signal to the gate of Power MOSFET Q1. When this gate drive signal reaches the threshold voltage of Power MOSFET Q1, Power MOSFET Q1 begins conducting current. Current continues to increase as the gate voltage of Power MOSFET Q1 is increased. As current increases, the voltage drop across sense resistor R2 increases proportionally until sufficient voltage exist on the base of transistor Q4 to turn on transistor Q4. The value of Rs is chosen to safely limit destructive shoot-through current without interfering during conduction of normal (peak) operating current of the inductive load. As transistor Q4 begins to conduct, the voltage applied to the high impendance input lead 2 of the emitter-follower stage formed by transistors Q2 and Q3 is decreased, reducing gate drive voltage to Power MOSFET Q1, in turn reducing the shoot-through current conducted by Power MOSFET Q1 by a factor $G_{fs}$, where $G_{fs}$ is the gain of power MOSFET Q1, and is equal to $\Delta I_{out}/\Delta V_{in}$. where $\Delta I_{out}$ is the change in current conducted by power MOSFET Q1 for a change in gate voltage $\Delta V_{in}$. When the opposing diode recovers, the shoot-through current decreases, base drive to transistor Q4 is reduced, and transistor Q4 turns off allowing the gate voltage applied to Power MOSFET Q1 to quickly transition to the full enhancement voltage of Power MOSFET Q1, causing Power MOSFET Q1 to turn fully on.

The teachings of this invention are readily implemented for both N-channel and P-channel Power MOSFETs, and can be used to limit shoot-through current on both the upper and lower devices of half-bridge and full H-bridge circuits.

All publications and patent applications are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A circuit for switching current to an inductive load comprising:
   a high-side MOSFET with an intrinsic body-drain diode to clamp inductive flyback energy, said high-side MOSFET having a drain connected to a supply voltage, a source, and a gate connected to a source of bias potential;
   a low-side N-channel MOSFET having a source connected to a supply return, a drain connected to said source of said high-side MOSFET and through an inductive load to said supply return, and a gate;
   means for sensing the current between said source and drain of said low-side MOSFET;
   a control input terminal for receiving a control signal indicating when said low-side MOSFET is to turn on; and
   means responsive to said control signal for supplying a bias signal to said gate of said low-side MOSFET in order to cause said low-side MOSFET to turn on, said means responsive reducing said bias signal when said means for sensing determines that said current flow between said source and drain of said low-side MOSFET exceeds a predetermined magnitude during the recovery time (Trr) of said intrinsic body-drain diode of said high-side MOSFET.

2. A circuit as in claim 1 wherein said bias signal is further reduced in response to further increases in current between said source and drain of said low-side MOSFET above said predetermined magnitude.

3. A circuit as in claim 1 wherein said means for sensing comprises a resistor connected in the path between said supply voltage and said supply return.

4. A circuit as in claim 1 wherein said reduction of said bias signal serves to limit said current flow between said source and drain terminals.

5. A circuit as in claim 4 wherein said current is limited to approximately said predetermined magnitude.

6. A circuit as in claim 1 wherein said means responsive comprises a transistor.

7. A circuit for switching current to an inductive load comprising:
- a low-side MOSFET with an intrinsic body-drain diode to clamp inductive flyback energy, said low-side MOSFET having a drain connected to a supply return, a source, and a gate connected to a source of bias potential;
- a high-side P-channel MOSFET having a source connected to a supply voltage, a drain connected to said source of said low-side MOSFET and through an inductive load to said supply return, and a gate;
- means for sensing the current between said source and drain of said high-side MOSFET;
- a control input terminal for receiving a control signal indicating when said high-side MOSFET is to turn on; and
- means responsive to said control signal for supplying a bias signal to said gate of said high-side MOSFET in order to cause said high-side MOSFET to turn on, said means responsive reducing said bias signal when said means for sensing determines that said current flow between said source and drain of said high-side MOSFET exceeds a predetermined magnitude during the recovery time (Trr) of said intrinsic body-drain diode of said low-side MOSFET.

8. A circuit as in claim 7 wherein said bias signal is further reduced in response to further increases in current between said source and drain of said high-side MOSFET above said predetermined magnitude.

9. A circuit as in claim 7 wherein said means for sensing comprises a resistor connected in the path between said supply voltage and said supply return.

10. A circuit as in claim 7 wherein said reduction of said bias signal serves to limit said current flow between said source and drain terminals.

11. A circuit as in claim 10 wherein said current is limited to approximately said predetermined magnitude.

12. A circuit as in claim 7 wherein said means responsive comprises a transistor.

13. A circuit as in claim 3 wherein said resistor is connected between said supply return and said source of said low-side MOSFET.

14. A circuit as in claim 9 wherein said resistor is connected between said voltage supply and said source of said high-side MOSFET.

* * * * *